United States Patent [19]
Gale et al.

[11] Patent Number: 6,008,987
[45] Date of Patent: Dec. 28, 1999

[54] ELECTRONIC CIRCUITRY

[75] Inventors: Geoffrey N. Gale, Nepean; John H. Watkins, Ottawa, both of Canada

[73] Assignee: Nortel Networks Corporation, Montreal, Canada

[21] Appl. No.: 09/062,773

[22] Filed: Apr. 21, 1998

[51] Int. Cl.⁶ ................................................. H05K 7/20
[52] U.S. Cl. .................. 361/700; 165/104.33; 174/15.2; 361/719
[58] Field of Search .......................... 62/259.2; 174/15.2, 174/252, 16.3; 165/80.3, 80.4, 185, 104.33, 104.34; 257/714, 715; 361/699, 700, 704, 707, 717–719, 722, 816, 818

[56] References Cited

U.S. PATENT DOCUMENTS

| | | |
|---|---|---|
| 3,651,865 | 3/1972 | Feldmanis . |
| 4,366,526 | 12/1982 | Lijoi . |
| 5,343,358 | 8/1994 | Hillbrink . |
| 5,365,749 | 11/1994 | Porter . |
| 5,398,748 | 3/1995 | Yamaji . |
| 5,459,639 | 10/1995 | Izumi . |
| 5,513,070 | 4/1996 | Xie . |

OTHER PUBLICATIONS

"Enclosure—Heat losses", Pioneer Electronic, 1 page, Japan 128584, Oct. 1979, Ploe.

*Primary Examiner*—Gerald Tolin
*Attorney, Agent, or Firm*—Angela C. de Wilton

[57] ABSTRACT

An electronic circuit in which a heat pipe is mounted on a substrate for transporting heat from one region to another, the heat pipe also being secured to the substrate at a plurality of positions along the heat pipe for the purpose of increasing the stiffness of the substrate. The heat pipe may extend across a surface of the substrate or around an edge of the substrate. Heat conductive paths from the heat source may be provided by a ground plane within the substrate or a heat conductor may extend from the heat source to the heat pipe at a position spaced from the substrate.

10 Claims, 3 Drawing Sheets

ELECTRONIC CIRCUITRY

This invention relates to electronic circuitry which may have, for instance, printed circuit board, ceramic, or metal substrates.

An expense which it would be desirable to reduce or eliminate in the manufacture of electronic circuitry is that associated with the structure necessarily added to remove hear from heat sources, e.g. electronic components which are operating at relatively high temperatures, in order to allow for dissipation of that heat into the surrounding environment. Without heat removal, or with inadequate heat removal, such electronic components may overheat and this may result in their operational failure thereby resulting in failure of the electronic circuitry and in equipment to which the electronic circuitry is connected. Overheating may also be caused to adjacent components whereby they may fail. Heat removal means are thus an essential requirement for electronic circuitry in which undesirable heat regions are generated.

It may also be found that certain electronic components do not meet operational expectations, because their temperatures are too low for efficient operation. In such cases, it is convenient to remove heat from a heat source on a substrate and direct that heat to the region of the substrate in which these operational components are placed. This procedure will raise their temperatures to overcome the problems of inefficiency.

Further, in many electronic circuitry designs, surface mount components are carried upon substrates. These surface mount components have terminals which are soldered to terminals of the circuitry and are retained on the substrates by the terminal junctions so produced. Such surface terminal junctions may be vulnerable to breakage and the breakage of any junction will undoubtedly result in reduced, or incorrect, performance of an electronic circuit. This places the performance of equipment of which the electronic circuit forms a part, in jeopardy. One way in which terminal junctions on substrates may be broken is, quite simply, by causing flexure of the substrates. Even a slight degree of flexure may be sufficient to break some terminal junctions and thus a substrate may need to be extremely rigid in the vicinity of the surface mount components.

In order to prevent or reduce terminal junction breakage associated with surface mount components, it is conventional practice to provide a substrate with stiffening members to rigidify the board. Such stiffening members are formed in any required manner and may extend around edge regions of the substrate, or, in some designs, are known go extend across central regions of substrates. A problem with these stiffening members is that while they are necessary from a mechanical engineering standpoint, they add nothing to the circuitry design. Such stiffening members are therefore an expense requirement in electronic circuitry manufacture which it would be advantageous to eliminate or reduce if this were a practical possibility.

The invention seeks to provide an electronic circuitry which provides a means for minimizing stiffening member and heat transportation costs.

Accordingly, the present invention provides an assembly of an electronic circuit including a substrate and a heat source, and at least one heat pipe having a heat collection region along part of its length, the heat collection region for collecting heat to be created in use of the heat source, and a heat emission region along another part of its length for emitting heat transported to the heat emission region from the heat collection region, the heat pipe being secured to the substrate at a plurality of cross-sectional positions along the heat pipe to provide a structure of substrate and heat pipe in which the heat pipe increases the stiffness of the substrate.

The term "heat pipe" as referred to in the present invention above, is intended to include heat pipes which employ a wick to transport heat against gravity and thermosiphon heat pipes.

In constructions according to the invention, heat removal from the heat source and stiffening of the substrate are provided by a single structure, i.e. the heat pipe. This minimizes the elements necessary in the assembly for rendering it functional electrically, while ensuring precautionary measures are taken for stiffening the substrate to prevent breakage of solder joints and for removal of hot spots in regions of the substrate. The heat pipe is ideal for heat removal and for providing a stiffening function, because the tubular shape inherently provides stiffness to the heat pipe itself. Parameters for this stiffness include the material of the heat pipe and the pipe thickness and its outside diameter.

To transmit heat into the heat pipe from the substrate at the heat collection region, there is preferably provided a heat conductive medium between the heat pipe and the substrate. This heat conductive medium may be tin surrounding the heat pipe and which can form a gastight seal when mechanically deformed. It may be convenient to dispose the heat collection region in close proximity to the heat source. In such a case, heat may be conducted from the component, into the substrate and then to the heat pipe. However, this type of arrangement may restrict the rate of heat removal because of poor heat conductivity of the substrate. Thus, it is preferable, whether or not the heat pipe is in close proximity to the heat source, to transmit heat through the substrate by way of a heat conductive means provided by the substrate. Conveniently, this heat conductive means may be provided by a copper layer or copper path carried upon or within the substrate. In one practical construction a ground plane or planes extending through the substrate may be used to transmit heat to the heat pipe.

In certain structures within the scope of the invention, the heat pipe extends beyond the boundary of the substrate to a heat sink which is to be located in a cooling fluid for extracting heat from the heat pipe. The cooling fluid may be air, or in certain constructions, an inert gas or a cooling liquid, within which the heat sink is immersed, may be used. In any event, with these types of structures, in which the cooling fluid lies outside the boundaries of the substrate, the substrate may be sealed from the cooling fluid so that the heat source and other electronic components cannot become contaminated by either the cooling fluid or by any foreign material such as dust or other particles. The substrate may in such cases, therefore, be contained within an enclosure, e.g. to provide a sealed circuit pack.

Alternatively, where it is required to locate the substrate itself in a cooling fluid, a heat source which requires cooling, may be provided with its own individual cover. The heat pipe may be located adjacent to the cover or may be soldered or otherwise thermally connected to the cover for extracting heat directly from the cover so as to cool the component.

It is also within the scope of the invention to provide assemblies in which the heat pipe does not extend lengthwise beyond boundaries of the substrate. In such assemblies, the heat pipe is operable to remove heat at the heat collection region and have it removed at the heat emission region back into the substrate at which position the substrate is cooler than at the heat collection region.

In preferred and practical constructions according to the invention, a heat pipe is secured only at a plurality of spaced cross-sectional positions indicated above, the number and spacing of these positions being chosen to provide the desired substrate stiffness. For this purpose, the heat pipe may be provided with laterally extending holding means at the spaced positions, the holding means being secured to the substrate possibly by screw-threaded elements, i.e. in the form of clips in any desired configuration. As an alternative to screw-threaded elements, the heat pipe is soldered or otherwise bonded onto the substrate. With soldering or other bonding methods, the heat pipe may be secured either totally along its length directly to the substrate or by spaced elongate sections of its length. Where solder or other bonding materials are used and within the confines of known engineering limits, these materials may need to be relied upon for their heat conductive capabilities for heat transfer purposes.

Embodiments of the invention will now be described, by way of example, with reference to the accompanying drawings, in which.

In the embodiments and modifications to be described, electronic circuitry has been designed to locate heat sources from which heat needs to be removed in convenient positions for locating heat pipes for removing heat from those heat sources while employing the heat pipes as suitable stiffeners for substrates.

Although the invention is applicable to electronic circuitries having ceramic or metal substrates also, the embodiments to be described are concerned with those having printed circuit boards.

Figure 1:
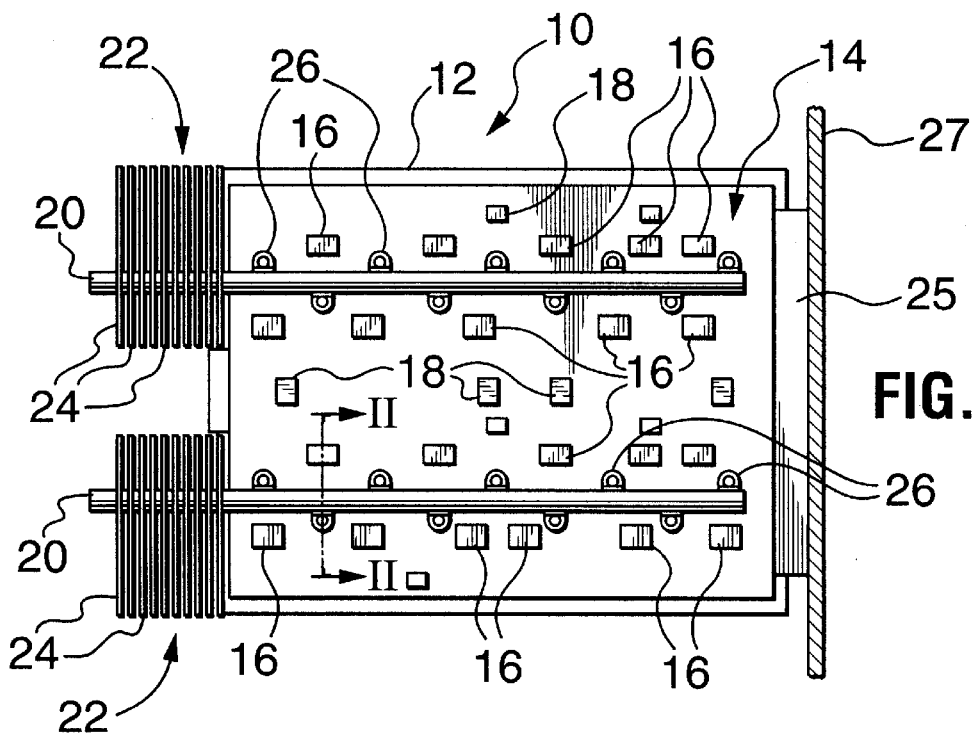
FIG. 1 is a diagrammatic plan view of a circuit pack including an assembly of printed circuit board, heat source and heat pipe according to a first embodiment.
Figure 2:
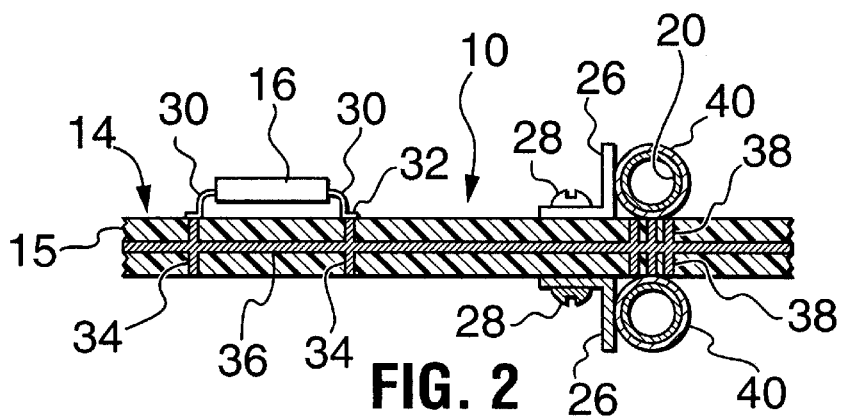
FIG. 2 is a cross-sectional view of the first embodiment taken along line II—II in FIG. 1.

In a first embodiment, with reference to FIGS. 1 and 2, a circuit pack 10 comprises an enclosure 12 which seals within it a printed circuit board 14, the enclosure 12 acting as an environmental shield and also as an EMI shield. The printed circuit board 14 forms part of an assembly with a plurality of heat sources forming part of its electrical circuitry and heat pipes and heat sinks as will now be described. On one or both surfaces of a substrate 15 of the printed circuit board, heat sources in the form of electronic components 16 operate at relatively high temperatures and are located substantially along four straight lines across the substrate as shown in FIG. 1 while other heat sources 18 are disposed elsewhere upon the substrate. The lines of the electronic components 16 are positioned so that two heat pipes 20 are each disposed between a pair of lines of components. The heat pipes 20 are parallel to each other and extend for substantially the full length of the substrate. The heat pipes on the, or each, side of the substrate extend from one edge of the substrate as shown at the left hand side of FIG. 1, and out through the enclosure 12 to which they are sealed and terminate at heat sinks 22 formed by a plurality of parallel fins 24. The heat sinks 22 are to be disposed in a cooling airstream outside the enclosure 12 whereby the electronic circuitry is protected from any contaminants in the cooling air. At the opposite edge of the substrate, a connector 25 mounted upon the substrate extends through the enclosure 12 to be connected to a back plane 27.

It is intended that the heat pipes 20 should function both as a means for removing heat from the relatively hotter operating electronic components 16 and as stiffeners for the substrate 15. In this embodiment, as in other structures within the scope of the invention, the heat pipes are held onto the substrate in any practical manner which will have the effect of increasing the stiffness of the substrate. The object to be achieved by this is to prevent breakage of soldered junctions between terminals of components and terminals on the substrate.

Stiffening is achieved in this embodiment by providing each heat pipe 20 with a plurality of holding means by which it is held to the substrate. Each holding means comprises an L-shaped lateral extension 26 of the heat pipe. One leg of each extension is soldered or otherwise securely bonded to its heat pipe 20 and the other leg is securely attached onto the surface of the substrate by any suitable means, such as a screw-threaded means 28 as shown in FIG. 2. At each of the positions of the holding means 26, each heat pipe is immovable relative to the substrate 15. The spacing between the extensions 26 is such that no substantial flexing of the substrate may occur, i.e. as indicated above, the flexibility allowable does not permit any of the soldered junctions between terminals of the components on the substrate and the substrate terminals to be broken due to substrate flexure.

Heat is conducted from each of the electronic components 16 to a heat collection region of a heat pipe by the structure shown in FIG. 2. Each of the electronic components 16 is connected to the substrate not only by signal leads (not shown) which are connected to signal terminals on the substrate, but also by ground leads 30 which are soldered, at solder junctions 32 to copper filled vias 34 which thermally connect the leads 30 to a copper ground plane 36. The ground plane 36 is to be connected to ground in use in well known manner. However the ground plane 36 is also connected to heat conductive pathways provided by copper or solder filled vias 38 which extend beneath the heat pipes 20 for transmitting heat to the heat pipes. The heat pipes conveniently have their surfaces covered in a layer 40 of tin which is provided by a conventional "tinning" operation known in the electrical industry. The tin lies in intimate contact with the substrate surface and with the ends of the filled vias to convey heat to the heat pipes. Heat is then transported along each heat pipe in conventional manner, i.e. by fluid flow. At heat emission regions of the heat pipes, i.e. at the fins 22, the heat is conducted into the fins to be dispersed in the cooling airstream by convection.

As may be seen therefore from the first embodiment, the heat pipes 20 perform the main function of transporting heat from the electronic components 16 while also performing a stiffening function for the substrate 15. Hence, the requirement for stiffening members separate from cooling means for the components is not necessary. This results in a reduction in parts required in the total assembly and also an accompanying reduction in cost.

In further embodiments and modifications thereof now to be described, features similar to or of similar operation to those described in the first embodiment employ the same reference numerals.

The construction of the heat pipes, their location upon, and the method of securing them to a substrate may be different in various ways from that described in the first embodiment.

Figure 3:
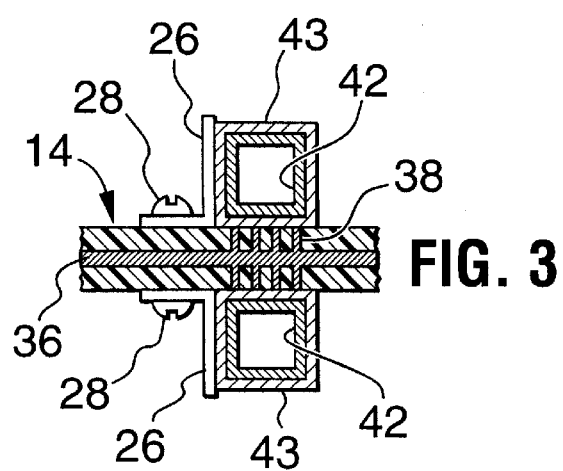
FIGS. 3 is a scrap view taken along line II—II in FIG. 1 showing a modification to the first embodiment.

For instance, in a modification of the first embodiment, shown in FIG. 3, the heat pipe 20 is replaced with a heat pipe 42 of square or rectangular section. This heat pipe is tinned with a layer 43 of tin which has heat conductive contact with the vias 38.

Figure 4:
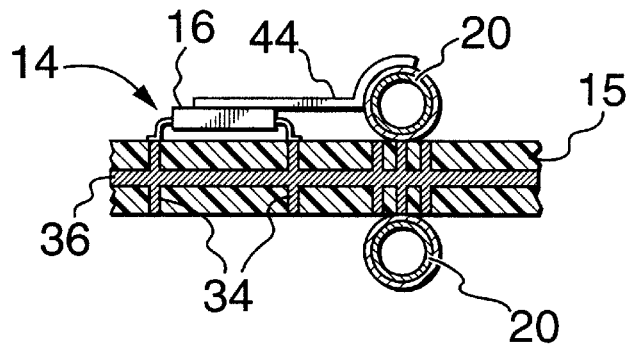
FIG. 4 is a view similar to FIG. 2 of a second embodiment.

In a second embodiment, as shown in FIG. 4, which is otherwise similar to the first embodiment, heat is conveyed to each heat pipe 20 by a heat conductive means spaced above the substrate in addition to, or instead of, heat transference through a ground plane as in the first embodiment. In the second embodiment and with respect to each component 16, the heat conductive means above the substrate 15 comprises a heat conductive member in the form of a plate or strip 44. This strip is soldered at one end to a surface of the component 16 and at the other end to its respective heat pipe 20.

Figure 5:
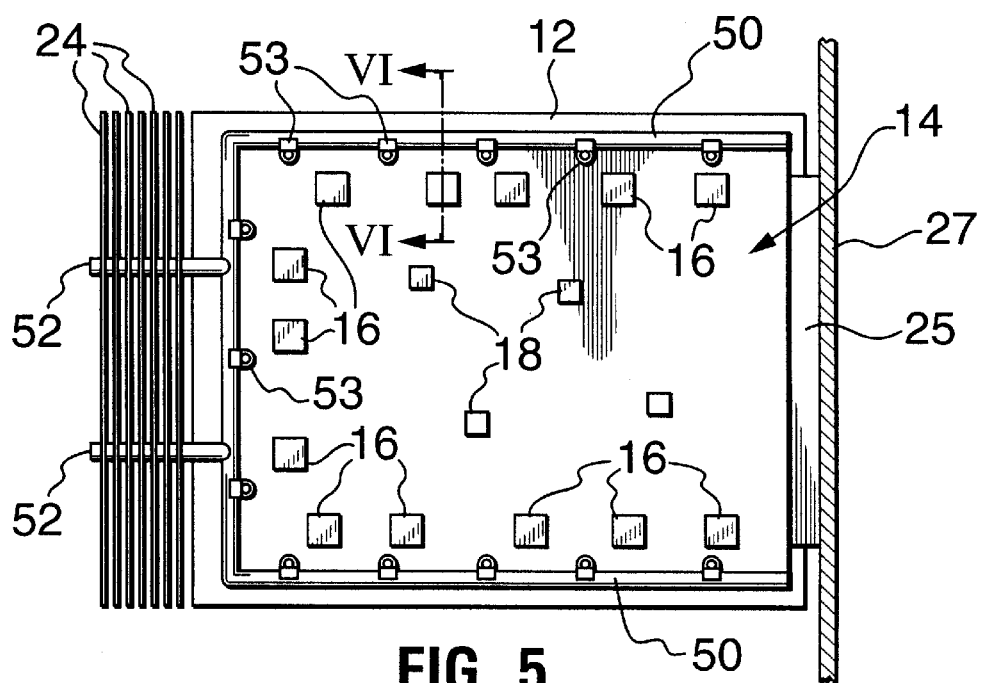
FIG. 5 is a view similar to FIG. 1 of a third embodiment.
Figure 6:
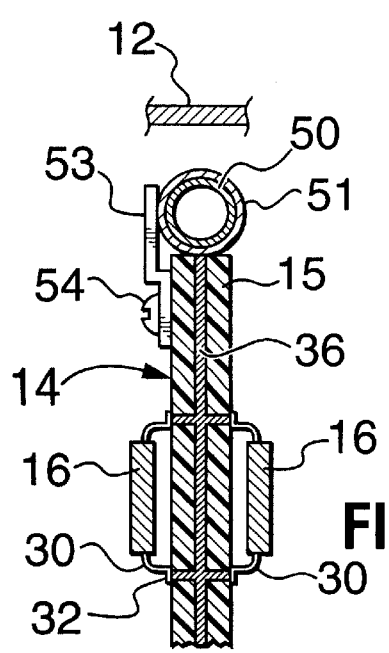
FIG. 6 is a cross-sectional view taken along line VI—VI in FIG. 5 and to a larger scale.

FIG. 5 which shows a third embodiment, clearly indicates that there are various ways in which heat pipes may be positioned and oriented upon a substrate 15 to act both as heat removal members and stiffeners. In the third embodiment, the electronic components 16 are disposed around edges of the substrate. A heat pipe 50 having a tin layer 51 is positioned and secured along three edges of the substrate 15 to provide a U-shaped heat pipe structure. At the base of the U-shape, short heat pipe extensions 52 extend in sealing engagement through the enclosure 12 to terminate in the heat exchange fins 24. While the heat pipe may be secured to the substrate in any desired manner, as shown by FIG. 6, the heat pipe 50 is connected at spaced apart positions by a plurality of lateral extensions 53 which are secured to the substrate 15, possibly by screw-threaded means 54. In this embodiment, heat may be transmitted directly into the heat pipe 50 from each component 16 from the edges of the ground plane 36.

Figure 7:
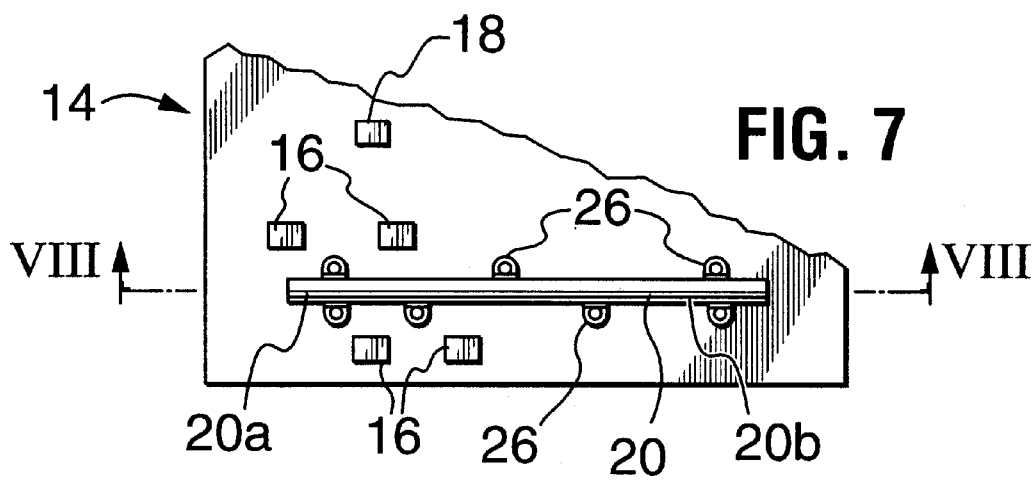
FIG. 7 is a view similar to FIG. 1 of a fourth embodiment.
Figure 8:
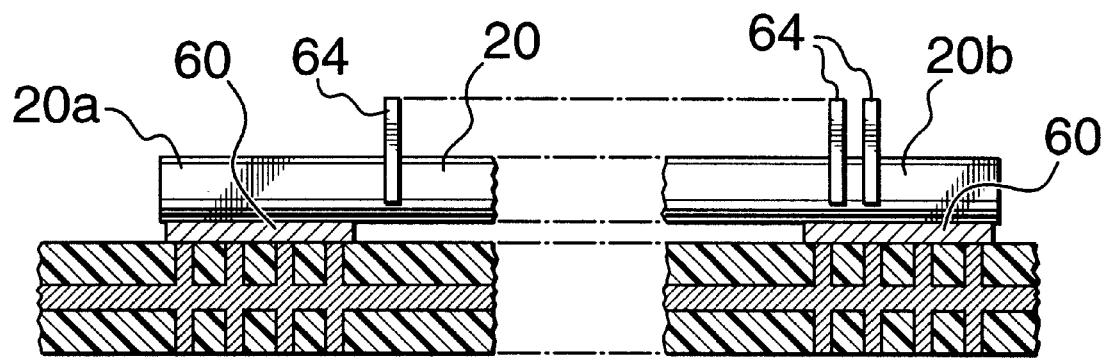
FIG. 8 is a cross-sectional view of the fourth embodiment taken along line Vlll—Vlll in FIG. 7 and to a larger scale.

It is not necessary for a heat pipe to extend beyond the edge boundaries of the substrate. For instance, as shown in a fourth embodiment, in FIG. 7, a heat pipe 20 has one end 20a disposed between relatively hot electronic components 16 at which it has a heat collection region. The heat pipe continues longitudinally to a heat emission region at its further end 20b and within the edge boundaries of the substrate. With this arrangement, the heat is transported from the component 16 at a relatively hot substrate region to a cooler substrate region for heat dissipation purposes. For this purpose, and as shown in FIG. 8, a heat conductive material 60 lying between the heat pipe and the substrate may be disposed solely at its two end regions. This ensures that at the one end of the heat pipe, the heat is conducted, perhaps by means described in previous embodiments, into the heat pipe, but is mainly dispersed at its other end into the substrate, i.e. at a controlled location a specified distance away from the component 16.

In the fourth embodiment, the heat pipe 20 may be positioned in the path of a cooling airstream passing across a surface of the substrate. In this case, to assist in heat removal, the heat pipe, as shown in FIG. 8, is optionally provided with a plurality of spaced apart heat exchange fins 64 extending from the heat pipe surface into the airstream.

Figure 9:
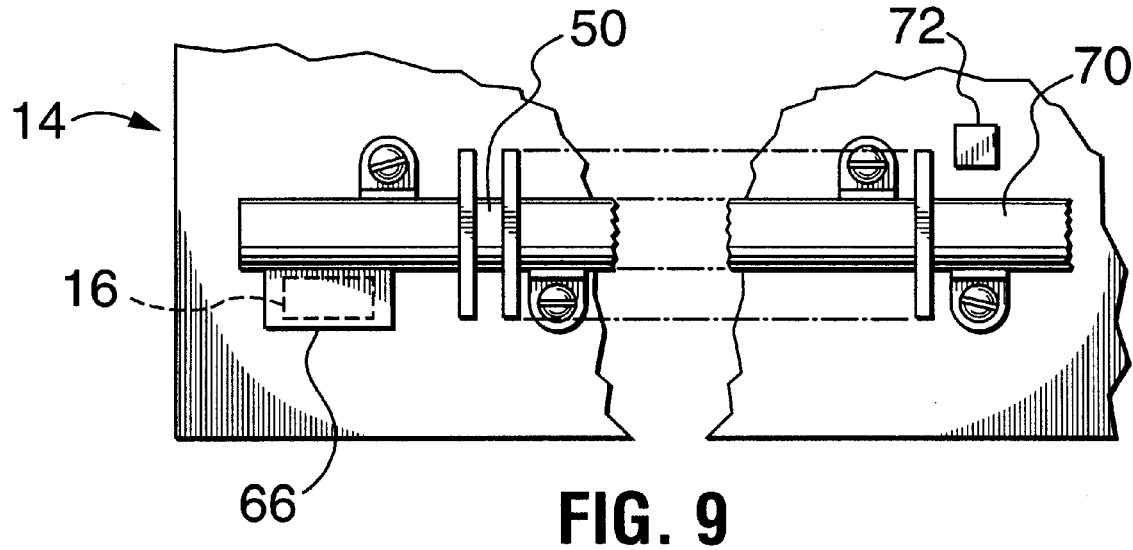
FIG. 9 is a plan view of part of an assembly according to a fifth embodiment.

In a fifth embodiment, as shown in FIG. 9, an electronic component 16 from which heat needs to be removed is provided with its own individual EMI and environmental shield 66. In this particular case, it is convenient to solder a heat pipe 50 at its heat collection region, i.e. at one end, to the shield 66. In this way heat from the component 16 is taken at least partly into the heat pipe 50 through the environmental shield 66 to be transported along the heat pipe to its heat emission region 70. The heat pipe 50 may also be provided with spaced apart fins 64 as shown in FIG. 9 for removal of heat with the heat pipe located in an airstream.

The invention may also be used to transport heat from a hot source on a substrate to a cooler region in which an electronic component is located and which, without additional heat, is of too low a temperature to operate efficiently. This is indicated in the fifth embodiment in which the heat emitted at the heat emission region 70 of the heat pipe, heats the surrounding regions of the substrate 68 so as to increase the temperature of an electronic component 72 carried upon that region, thereby improving the operational efficiency of that component.

The fifth embodiment thus performs the dual function of removing heat from one region of the substrate to lower the operational temperature of a component in that region, and of transporting the heat to another region of the substrate to increase the operating temperature of another component, thereby increasing the operational efficiency of both components.

What is claimed is:

1. An assembly of an electronic circuit including:
   a) a multilayer printed circuit board comprising at least one substrate layer and a ground plane;
   b) an electronic heat source mounted upon one side of the substrate layer remote from the ground plane, the heat source having signal leads connected to signal terminals on the one side of the substrate layer and also having at least one ground lead;
   c) at least one thermally and electrically conductive path extending through the substrate layer and interconnecting the ground lead of the heat source to the ground plane to provide a ground for the heat source and to conduct heat from the heat source into the ground plane;
   d) at least one heat pipe having a heat collection region along part of its length, the heat collection region spaced from the heat source and heat conducively interconnected to the ground plane to collect heat from the heat source through the ground plane, the heat pipe also having a heat emission region along another part of its length for emitting heat transported to the heat emission region from the heat collection region; and
   e) means securing the heat pipe to the printed circuit board at a plurality of cross-sectional positions along the heat pipe to provide a structure of printed circuit board and heat pipe in which the heat pipe increases the stiffness of the printed circuit board.

2. An assembly according to claim 1 wherein the heat pipe is mounted upon an edge of the printed circuit board and is in heat conductive engagement with an edge of the ground plane.

3. An assembly according to claim 1 wherein the heat pipe extends longitudinally from the heat collection region, beyond the printed circuit board, and to the heat emission region which is spaced outwardly from the printed circuit board.

4. An assembly according to claim 3 wherein, at the heat emission region, the heat pipe is connected to a heat sink.

5. An assembly according to claim 4 wherein the printed circuit board and the heat source are sealed from ambient atmosphere by a surrounding enclosure and the heat sink is disposed outside the enclosure.

6. An assembly according to claim 1 wherein the heat emission region is at a location on the printed circuit board which in use is colder than the heat collection region and, at the heat emission region, the heat pipe is in heat conductive engagement with the printed circuit board for emitting heat into the printed circuit board.

7. An assembly according to claim 1 wherein the heat pipe extends across a surface of the printed circuit board while being spaced from side edges of the printed circuit board.

8. An assembly according to claim 1 wherein the heat pipe extends along at least one side edge of the printed circuit board.

9. An assembly according to 1 wherein the heat pipe is secured to the printed circuit board only at the plurality of cross-sectional positions, by holding means spaced apart along the heat pipe.

10. An assembly according to claim 9 wherein at each of the plurality of cross-sectional positions, the holding means comprises a lateral extension of the heat pipe, the lateral extension being secured to the printed circuit board.

* * * * *